United States Patent
Ohkura (10) Patent No.: US 7,262,512 B2
(45) Date of Patent: Aug. 28, 2007

(54) SURFACE MOUNT CHIP PACKAGE

(75) Inventor: Yoshihiro Ohkura, Iwata-gun (JP)

(73) Assignee: Yamaha Corporation (JP)

( * ) Notice: Subject to any disclaimer, the term of this patent is extended or adjusted under 35 U.S.C. 154(b) by 0 days.

(21) Appl. No.: 10/736,618

(22) Filed: Dec. 17, 2003

(65) Prior Publication Data

US 2004/0124514 A1    Jul. 1, 2004

(30) Foreign Application Priority Data

Dec. 20, 2002    (JP)    ............... 2002-370205

(51) Int. Cl.
*H01L 23/48*    (2006.01)
*H01L 23/52*    (2006.01)
*H01L 29/40*    (2006.01)

(52) U.S. Cl. .................... 257/786; 257/778; 257/797

(58) Field of Classification Search ............ 257/48, 257/337–738, 778–779, 786–787, 797, E23.001, 257/E23.179, E21.521, E21.525

See application file for complete search history.

(56) References Cited

U.S. PATENT DOCUMENTS 6,495,916 B1 * 12/2002 Ohuchi et al. .............. 257/737
6,787,892 B2 * 9/2004 Furuya et al. .............. 257/687

FOREIGN PATENT DOCUMENTS

| JP | 3-142848 | 6/1991 |
| JP | 04-323836 A | 11/1992 |
| JP | 2001-144197 A | 5/2001 |
| JP | 2002-176265 A | 6/2002 |
| TW | 399779 | 7/2000 |

OTHER PUBLICATIONS

Taiwanese Office Action dated Jun. 7, 2005 (w/English translation of relevant portions).

* cited by examiner

*Primary Examiner*—Hoai Pham
*Assistant Examiner*—Dilinh Nguyen
(74) *Attorney, Agent, or Firm*—Dickstein, Shapiro, LLP.

(57) ABSTRACT

A surface mount chip package comprises a package housing made of a prescribed resin, which is formed to cover a semiconductor chip while avoiding a plurality of conductors extending from the semiconductor chip. A plurality of solder balls are arranged in the package housing in correspondence with a main surface of the semiconductor chip having an integrated circuit and are interconnected with the conductors respectively. An index serving as a marking member is arranged together with the solder balls so as to bring a directivity realized by the shape thereof when viewed in the thickness direction of the semiconductor chip. This allows a user to easily recognize the inclination and position of the package housing without using the solder balls in view of the index, thus establishing a prescribed positioning for an electrical test such as a probing test.

8 Claims, 8 Drawing Sheets

SURFACE MOUNT CHIP PACKAGE

BACKGROUND OF THE INVENTION

1. Field of the Invention

This invention relates to surface mount chip packages such as chip size packages (or chip scale packages, i.e., CSPs), in which semiconductor chips are subjected to probing tests at precise positioning established with testers.

This application claims priority on Japanese Patent Application No. 2002-370205, the content of which is incorporated herein by reference.

2. Description of the Related Art

Chip size packages are known as one type of surface mount chip packages for holding semiconductor chips at prescribed positions; their sizes are substantially identical to sizes of semiconductor chips, so that they have been widely noted as packaging technologies realizing comprehensive reductions in scale and weight of electronic devices. When a semiconductor chip is mounted on a chip size package, a probing test is performed after a dicing process in order to increase the defect detection rate in a manufacturing stage. The probing test is performed on a wafer on which surface mold resins (or molded resins) as package housings are formed in advance and which is equipped with solder balls as external electrodes and is divided into pieces (or sections) by dicing, whereas an adhesive film is adhered to the backside of the wafer so as to maintain the original shape of the wafer even though the dicing is performed. The probing test is performed on each of individual sections of the wafer. In the following description, each individual section of the wafer, on which surface mold resins are formed and which is divided by dicing, is called a device chip, which is distinguished from a bare chip corresponding to the semiconductor chip in terminology.

The probing test is performed by bringing a probe electrode of a tester therefor into contact with electrodes of the device chip; therefore, it is necessary to establish prescribed positioning between the probe electrode and the electrodes of the device chip. In the general probing test that is performed on the other type of a package (without using a chip size package), prescribed positioning is established upon recognition of the inclination (or a rotation angle $\theta$) and position (X-Y coordinates) of a wafer based on a specific pattern of wires and scribe lines formed on a semiconductor chip, an example of which is disclosed in Japanese Patent Application Publication No. Hei 3-142848. In contrast, the chip size package is designed such that the semiconductor chip is covered with a mold resin, and it does not allow recognition of a specific pattern formed on the semiconductor chip when viewed from the exterior thereof. For this reason, in the probing test using the chip size package, the prescribed positioning is established upon recognition of an arrangement of plural solder balls as external electrodes.

Figure 6:
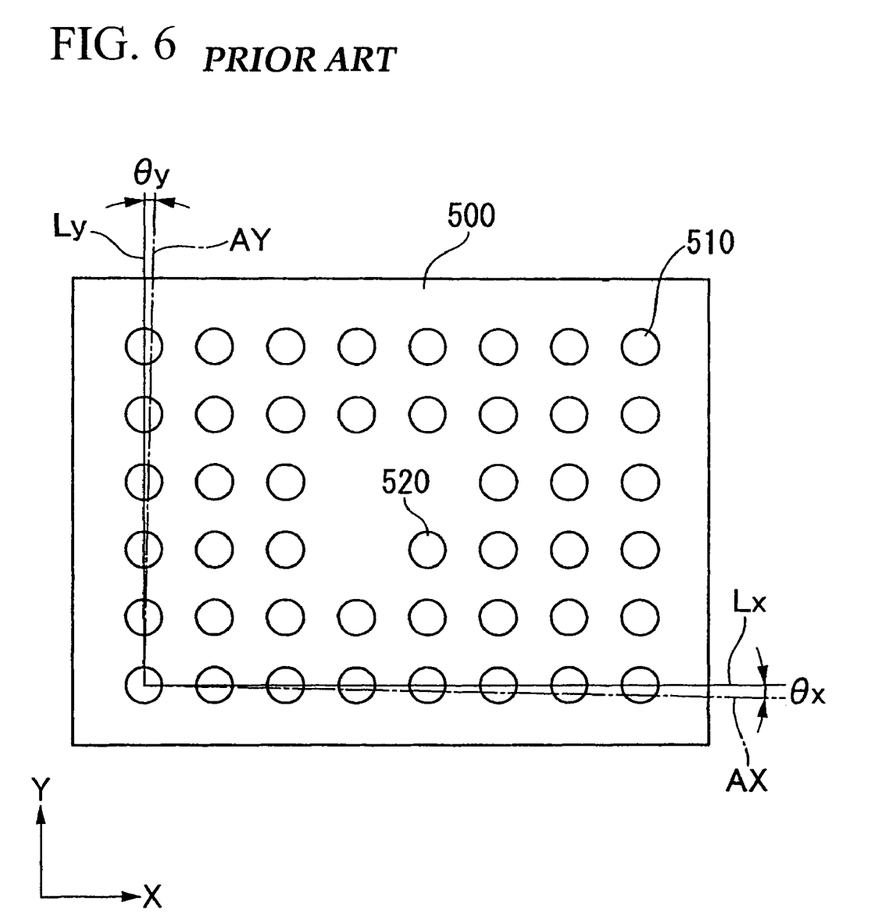
FIG. 6 shows an exterior appearance of a conventional chip size package with solder balls arranged for use in positioning.

FIG. 6 shows an example of an arrangement of solder balls 510 that are arranged on the surface (or the backside) of a package housing 500 (i.e., a mold resin) of the conventional chip size package. Herein, solder balls 510 are arranged in a matrix on the entire surface of the package housing 500, except at its center area, in such a way that eight balls are arranged in an X-axis direction, and six balls are arranged in a Y-axis direction. In addition, there is provided an index solder ball 520 for use in the user's recognition of a chip direction. In the probing test, an image of the plural solder balls 510 existing in a prescribed range of area is picked up and is subjected to image processing, thus determining a straight line Lx connecting the centers (or outer circumferences) of the balls lying in the X-axis direction and a straight line Ly connecting the centers (or outer circumferences) of the balls lying in the Y-axis direction. In order to set the reference for the positioning in the X-Y plane, a reference axis AX is set in the X-axis direction, and a reference axis AY is set in the Y-axis direction. That is, the prescribed positioning is established upon determination of the inclination of the device chip based on an angle $\theta x$ formed between the reference axis AX and the straight line Lx, and an angle $\theta y$ formed between the reference axis AY and the straight line Ly.

In the conventional technology for the detection of solder balls described above, it is necessary to use a special image processing technique in consideration of deformations of individual solder balls in order to determine the straight lines Lx and Ly each connecting solder balls. In other words, it is very difficult to use the existing image processing technique for the recognition of a specific pattern on the semiconductor chip. Because of the necessity of determining straight lines each connecting solder balls, it is necessary to pick up an image of solder balls existing in a relatively broad area. For this reason, it is very difficult to use the conventional image pickup device that can merely pick up a pattern with respect to a specific small area. This may raise the necessity for the user to repeatedly change the image pickup area covered by the image pickup device.

Each of the solder balls has an approximately circular shape; therefore, it is very difficult to recognize the inclination of the semiconductor chip upon detection of a single solder ball. For this reason, solder balls may be difficult to use for the detection of the aforementioned specific pattern, and it is therefore very difficult to use existing image processing techniques.

As a result, in the probing test using the chip size package, it is necessary to determine the arrangement of solder balls existing over a relatively broad area. This requires troublesome work to prepare a special image processing program and a special image pickup device for the probing test.

SUMMARY OF THE INVENTION

It is an object of the invention to provide a surface mount chip package that allows prescribed positioning to be established between a probe (e.g., an electrode) and subject elements (e.g., electrodes) without using solder balls for use in electrical testing of a device chip therefor.

This invention presents a surface mount chip package incorporating a semiconductor chip having an integrated circuit. The surface mount chip package of this invention comprises a package housing made of a prescribed resin, which covers the semiconductor chip while avoiding conductors extending from the integrated circuit, a plurality of external electrodes that are arranged in one side of the package housing corresponding to the main surface of the semiconductor chip and are interconnected with the conductors extended from the integrated circuit, and at least one marking member that is arranged on one side of the package housing and that has a directivity realized by its shape when viewed in the thickness direction of the semiconductor chip.

Due to the directivity realized by the shape of the marking member arranged in the package housing keeping the semiconductor chip, when the package housing is rotated about an axis corresponding to the thickness direction of the semiconductor chip (which substantially corresponds to the thickness direction of the package housing), a rotation angle thereof is reflected on and indicated by the direction of the marking member. This allows the user to easily recognize the inclination of the package housing in view of the direction of the marking member, so that the user can easily establish a prescribed positioning with respect to the external electrodes relative to a probe electrode of a tester used in a probing test. In the above, viewing the package housing in the thickness direction of the semiconductor chip indicates that when the semiconductor chip is held horizontally, for example, the user views it in a vertical direction (including vertically slanted directions). In addition, the directivity cannot be realized when the outline of the shape of the marking member is made entirely circular; in other words, the directivity can be realized by any outline shape that may allow the user to recognize rotation with ease. Due to the directivity realized by a prescribed shape of the marking member, the user can easily recognize the inclination of the external terminal(s) arranged on one side of the package housing, which in turn allows a prescribed positioning to be established.

Specifically, the marking member is formed in the prescribed shape including at least one linear portion in the outline thereof. That is, the direction of the marking member is represented by the inclination of the linear portion included in the outline of the marking member, whereby the directivity is certainly realized by the shape of the marking member. In short, the user can easily recognize the inclination of the package housing in view of the inclination of the linear portion included in the outline of the marking member.

Incidentally, the marking member can be formed using a copper post having a prescribed shape (e.g., a square shape), which yields an improvement in accuracy of formation of the marking member and which in turn increases positioning accuracy. Herein, the marking member can be covered with a solder layer, a solder print, a gold bump, and the like so as to improve reliability in manufacture because it is possible to avoid occurrence of oxidation of the copper post.

BRIEF DESCRIPTION OF THE DRAWINGS

These and other objects, aspects, and embodiments of the present invention will be described in more detail with reference to the following drawings, in which.

DESCRIPTION OF THE PREFERRED EMBODIMENTS

This invention will be described in further detail by way of examples with reference to the accompanying drawings.

1. First Embodiment

Figure 1:
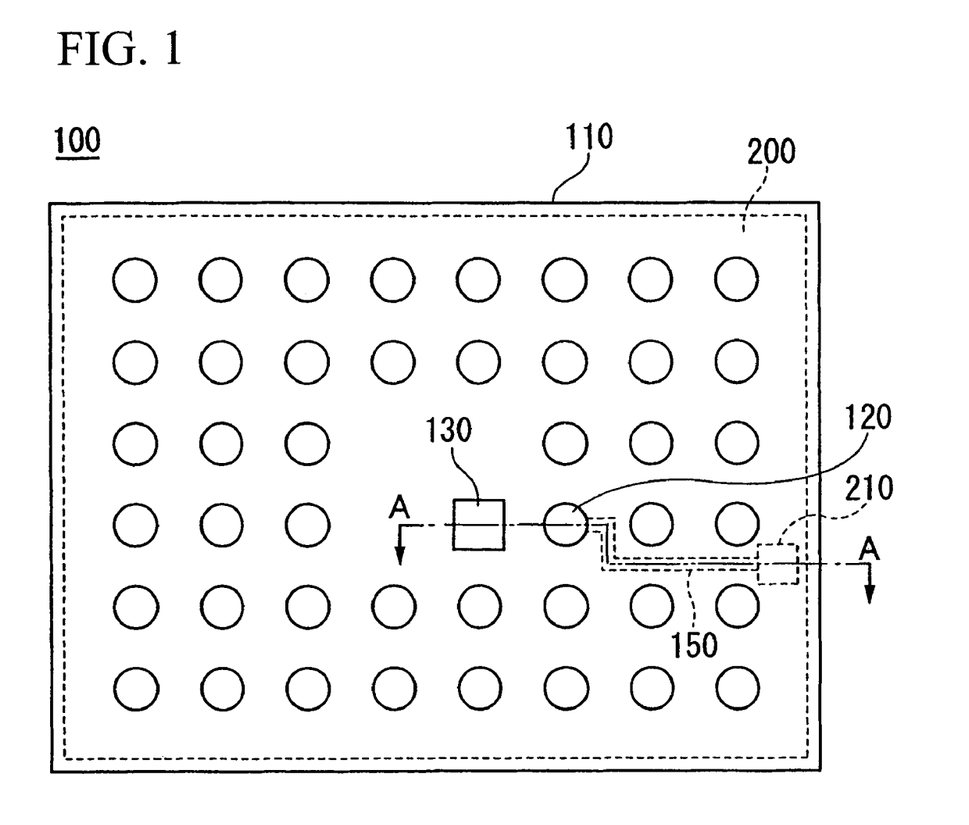
FIG. 1 shows an exterior appearance of a chip size package in accordance with a first embodiment of the invention.

FIG. 1 shows an exterior appearance of a prescribed surface (or a backside) of a chip size package 100 in accordance with a first embodiment of the invention. Herein, the chip size package 100 may correspond to one type of the surface mount chip package, and it can hold two-hundred 'square' semiconductor chips 200 individually therein. Each individual semiconductor chip 200 has an integrated circuit (not shown), which is formed on the main surface thereof, and is covered with a mold resin (or molded resin) forming a package housing 110. Incidentally, the mold resin is formed to avoid a copper post that is used as an index, which will be described later. That is, both of a copper post serving as an index and another copper post serving as a conductor are embedded in the mold resin.

Figure 2:
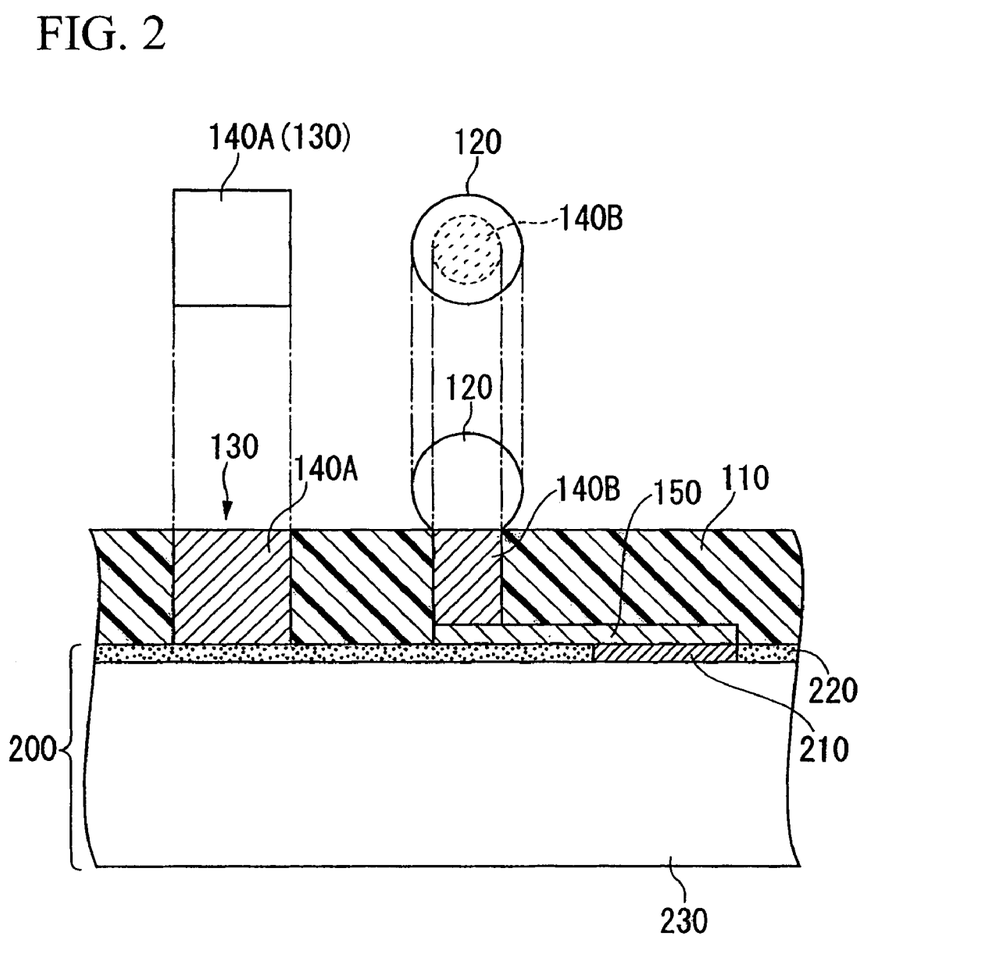
FIG. 2 is a cross sectional view taken along line A-A in FIG. 1, which shows the internal structure of the chip size package holding a semiconductor chip therein.

Solder balls 120 constituting external electrodes are arranged in a matrix form on one surface of the package 110 matching the main surface of the semiconductor chip 200, in other words, the exterior surface of the package housing 100 covering the main surface (forming the integrated circuit) of the semiconductor chip 200, except its center area. As shown in FIG. 2, each of the solder balls 120 is interconnected with a copper wire 150 via a copper post 140B within the layer of the mold resin forming the package housing 110, wherein the copper wire 150 is interconnected with a pad electrode 210 that is formed on the main surface of the semiconductor chip 200. FIG. 1 shows only a single pad electrode 210; actually, however, a plurality of pad electrodes are arranged in the peripheral area of the semiconductor chip 200 so that each of them is electrically connected with the corresponding solder ball 120.

In the center area in which no solder ball is arranged, there is provided an index 130 for the user to discriminate the chip direction. This index 130 is also used as a mark for use in the positioning of a prober that is one type of semiconductor inspection device, and it is formed on one side of the package housing 110 together with the solder balls 120. Specifically, the index 130 is formed and arranged to have a prescribed positional relationship with the plurality of solder balls 120. By using the index 130 as a mark, the user is able to distinguish each of the solder balls 120, i.e., external electrodes to which various types of signals are assigned.

Figure 7:
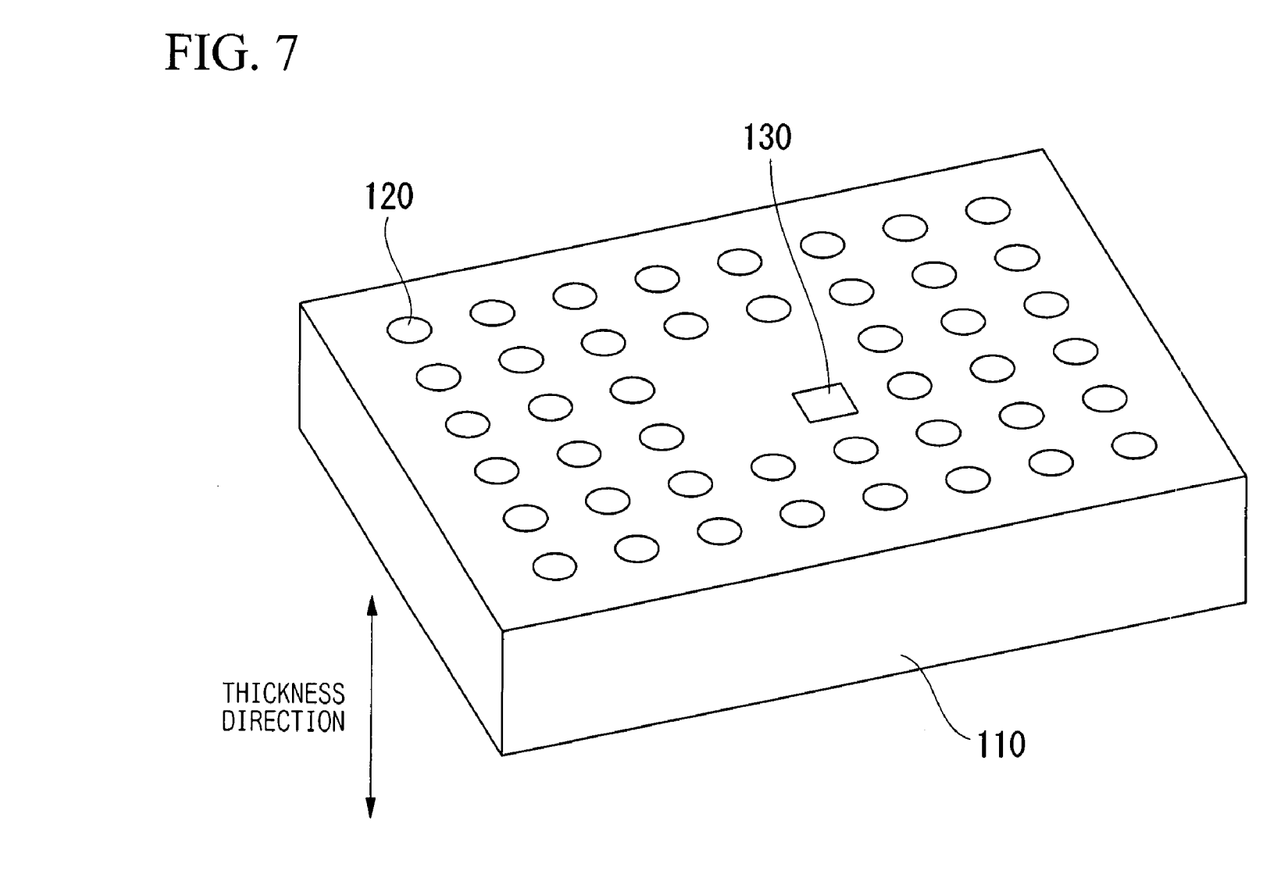
FIG. 7 is a perspective view showing the thickness direction of a package housing.

The index 130 is formed in a square shape in view of the thickness direction of the semiconductor chip 200 (i.e., the thickness direction of the package housing 110, see FIG. 7); in other words, the shape thereof has a specific directivity. Viewing the semiconductor chip 200 in its thickness direction indicates that the semiconductor chip 200 is viewed from above (including slanted directions) thereof when held horizontally and mounted on the stage of a prober (not shown), for example. However, the viewing direction of the index 130 is not specified to the extent that the user can visually recognize the inclination (or rotation) of the semiconductor chip 200 based on the viewed shape of the index 130.

The directivity of the shape of the index 130 indicates that when the chip size package 100 is inclined (or rotated), the inclination thereof can be expressed as the inclination of the viewed shape of the index 130, for example. For this reason, a true circular shape is not used for the shape of the index 130 because the true circular shape cannot be apparently changed in shape even when rotated, so that the user cannot visually recognize the inclination of the index 130 having the true circular shape. However, it is possible to adapt a circular outline to the index 130 when a prescribed figure representing directivity is shown in the circular shape. In the present embodiment, two sides of the square index 130 match arranging directions of the solder balls 120 in the X-axis direction and Y-axis direction respectively. Therefore, the user can visually recognize the inclination of the package housing 110, i.e., arranging directions of the solder balls 120, upon viewing of the two sides of the index 130.

FIG. 2 is a cross sectional view taken along line A-A in FIG. 1. For the sake of convenience, the length of the copper wire 150 is shown shorter in FIG. 2 than the length shown in FIG. 1. As shown in FIG. 2, a pad electrode 210 made of aluminum is formed on a substrate 230 of the semiconductor chip 200, and a protective film 220 made of polyimide is formed to avoid the pad electrode 210 on the substrate 230. The aforementioned copper wire 150 electrically interconnected with the pad electrode 210 is formed on the protective film 220, and a cylindrical copper post 140B is formed on the copper wire 150. In addition, a copper post 140A having a square-pole-like shape is formed as a discrimination member forming the index 130 on the protective film 220. In the present embodiment, the sectional area of the square-pole-shaped copper post 140A is set to be greater than the sectional area of the cylindrical copper post 140B. A space between the copper posts 140A and 140B is covered with a mold resin, by which the package housing 110 is formed.

Figure 8:
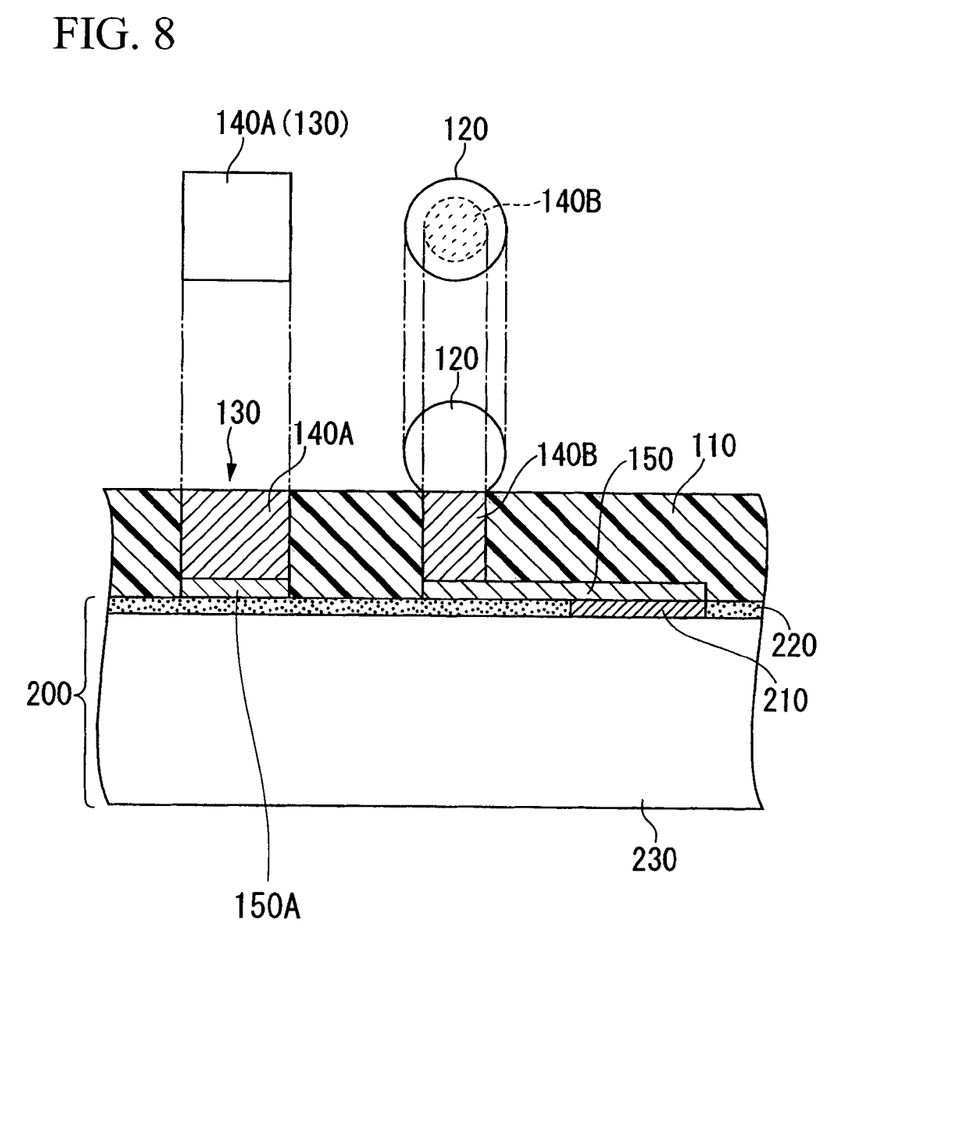
FIG. 8 is a cross sectional view taken along line A-A in FIG. 1, which shows a modified example of the internal structure of the chip size package shown in FIG. 2.

It is possible to partially modify the aforementioned structure in such a way that as shown in FIG. 8, a dummy copper wire 150A whose thickness is identical to that of the copper wire 150 is arranged under the copper post 140A. Particularly, in the case of the copper plating, the dummy copper wire 150A may serve as a plating bed. In addition, it is possible to reduce (or simplify) the manufacturing step by simultaneously forming the copper post 140A and the dummy copper wire 150A in accordance with the same method.

When the package housing 110 is formed, the entire surface of the semiconductor chip 200 including the copper posts 140A and 140B is covered with a mold resin, which is then polished to be at a prescribed thickness with respect to the copper posts 140A and 140B, so that the polished surfaces of the copper posts 140A and 140B substantially match the polished surface of the mold resin of the package housing 110, whereby the copper posts 140A and 140B partially emerge at the exterior surface of the package housing 110. As described above, the surface of the semiconductor chip 200 is entirely covered with the mold resin, which is formed to avoid the copper posts 140A and 140B and by which the package housing 110 is formed. As a result, the copper post 140A serving as the marking member as well as the copper post 140B and the package housing 110 serving as conductors are all formed at the same height. Then, a solder ball 120 is bonded onto the cylindrical copper post 140B by heat treatment. Thus, it is possible to completely form the square index 130 on one surface of the chip size package 100 keeping the semiconductor chip 200.

Figure 3:
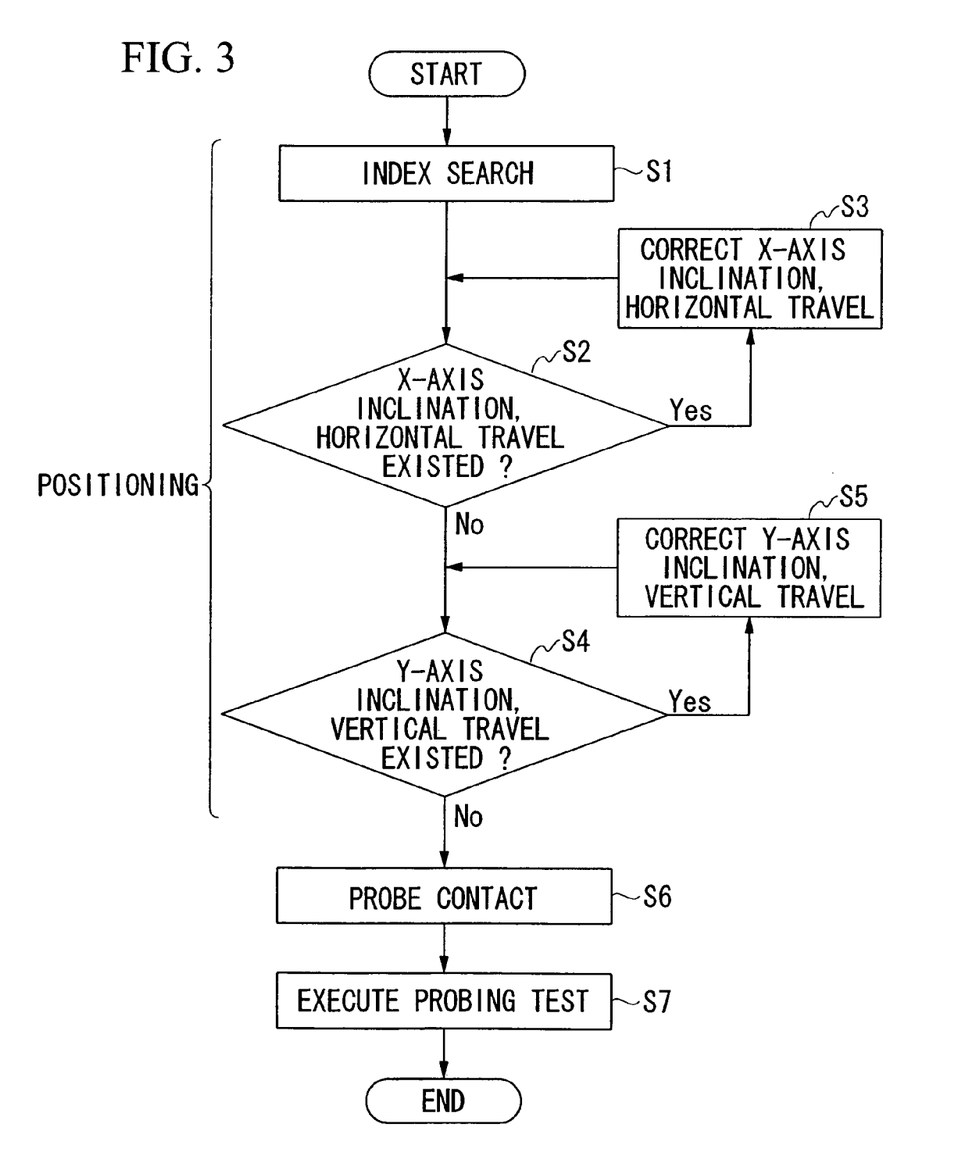
FIG. 3 is a flowchart showing procedures of a probing test performed on the semiconductor chip encapsulated in the chip size package.

Next, the flow of the probing test and the positioning method of the chip size package 100 in the probing test will be described in detail with reference to the flowchart of FIG. 3.

Figure 4A:
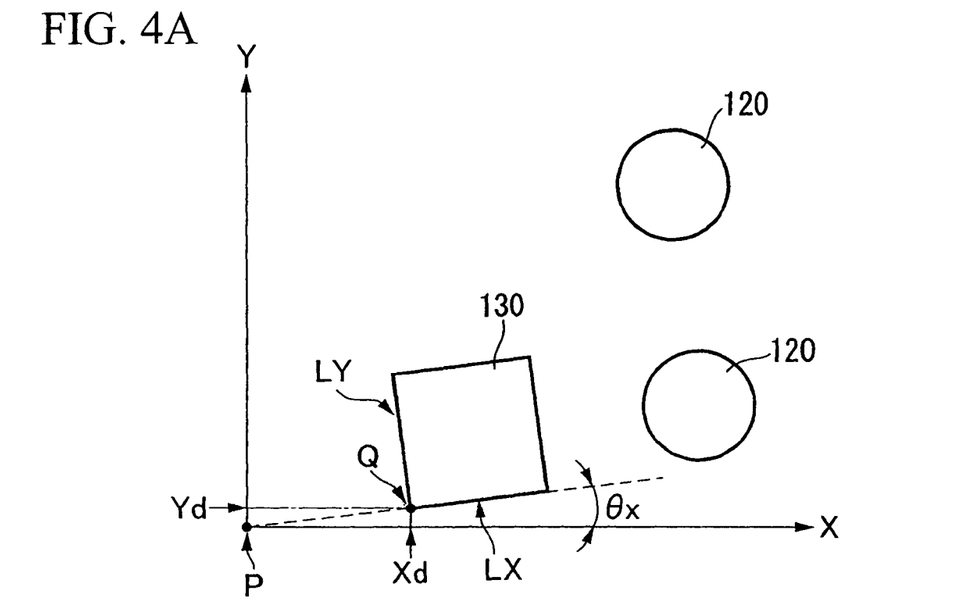
FIG. 4A shows a reference coordinate system in which a device chip corresponding to the chip size package of the first embodiment is initially positioned prior to a probing test while being inclined relative to the X-axis and the Y-axis.
Figure 4B:
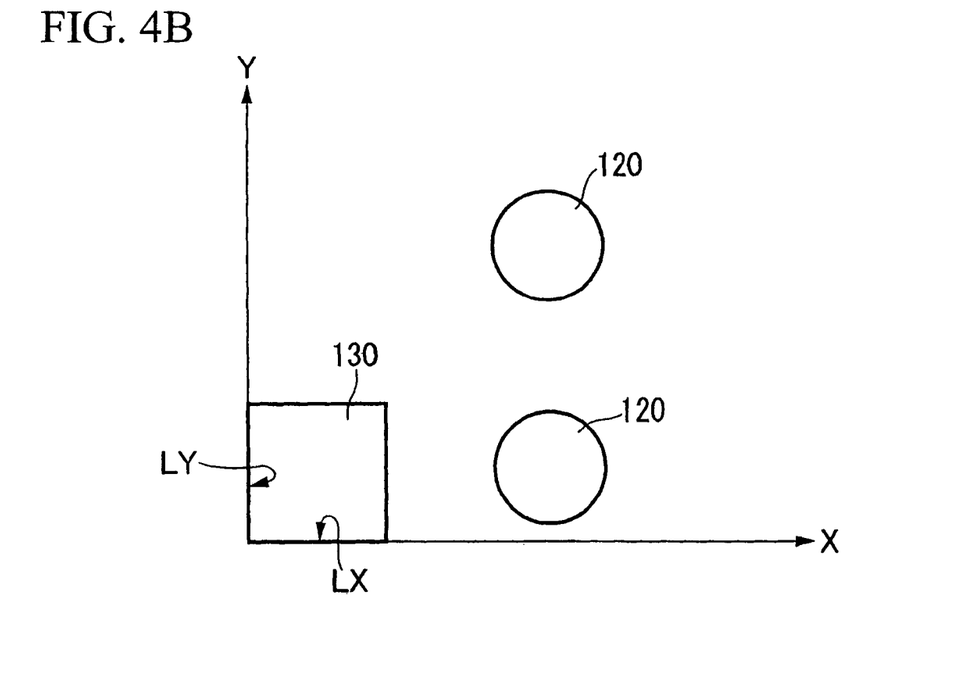
FIG. 4B shows a reference coordinate system in which the device chip is adequately corrected in positioning with respect to the X-axis and the Y-axis.

A prescribed coordinate system (hereinafter, referred to as a reference coordinate system; see FIGS. 4A and 4B) is defined in advance with respect to a prober used in the probing test in order to set a prescribed reference (or prescribed basis) for positioning to be established between the prober and the device chip. The reference coordinate system has an origin indicating a reference point P, wherein when a lower-left vertex Q of the 'square-shaped' index 130 matches the reference point P, and the inclination of the index 130 (defined by a lower side Lx and a left side LY that are respectively inclined from the X-axis and the Y-axis) becomes zero, it can be said that the prober matches the solder balls 120 of the chip size package 100 in positioning.

In the probing test, the user (or operator) mounts the device chip on the stage of the prober in such a way that its prescribed surface arranging the solder balls 120 and the index 130 are directed upwards; then, a prescribed positioning operation of the prober is started, wherein the prober first searches for the index 130 in step S1. Searching is implemented upon recognition of the square-shaped index 130 in view of an image that is picked up from the main surface of the device chip on which integrated circuitry is formed. When the prober recognizes the position of the index 130, a decision is made as to whether or not there exist an X-axis inclination relative to the X-axis of the reference coordinate system and an X-axis travel (or movement) (hereinafter, referred to as a horizontal travel) in the X-axis direction in step S2. Specifically, in the case of FIG. 4A, the X-axis inclination is represented by an angle θx formed between the lower side LX of the index 130 and the X-axis of the reference coordinate system, and the horizontal travel is represented by a distance Xd measured between the reference point P and the vertex Q of the index 130, whereby a decision is made as to whether or not there exists the angle θx and the distance Xd in the reference coordinate system.

When both of the angle θx and the distance Xd actually exist in the reference coordinate system, it is determined that there exists the X-axis inclination and horizontal travel, so that a decision result of step S2 is 'YES', and the flow proceeds to step S3. In step S3, the prober adjusts the rotation angle of the stage and the position of the X-Y coordinate system in such a way that both of the angle θx and the distance Xd become zero, thus correcting the X-axis inclination and horizontal travel. Then, the flow returns to the previous step S2, whereby the steps S2 and S3 are repeatedly performed until both of the angle θx and the distance Xd become zero. When the X-axis inclination is corrected, a Y-axis inclination (represented by an angle formed between the left side LY and the Y-axis) can be simultaneously corrected.

When both of the X-axis inclination and the horizontal travel are adequately corrected and become zero (i.e., when the decision result of step S2 is 'NO'), the flow proceeds to step S4 in which a decision is made as to whether or not there exists a Y-axis inclination relative to the Y-axis of the reference coordinate system and a Y-axis travel (referred to as a vertical travel) in the Y-axis direction. Both of the Y-axis inclination and the vertical travel are corrected in step S5. In the foregoing step S3, when the X-axis inclination is corrected, the Y-axis inclination is simultaneously corrected; therefore, in step S4, a decision is merely made as to whether or not there exists a deviation of the Y-axis inclination due to the correction of the vertical travel. When both of the Y-axis inclination and the vertical travel are adequately corrected and become zero. (i.e., when a decision result of step S4 is 'NO'), it can be said that a prescribed positioning is completely established between the prober and the device chip; that is, as shown in FIG. 4B, the vertex Q of the index 130 matches the reference point P of the reference coordinate system, and both of the X-axis inclination and Y-axis inclination regarding the lower side LX and the left side LY relative to the X-axis and Y-axis disappear.

After the completion of the positioning, the prober lowers down a probe electrode towards the device chip mounted on the stage, or the device chip is raised towards the probe electrode. As described above, the prescribed positioning is completely established because the vertex Q of the index 130 matches the reference point P of the reference coordinate system, and both of the X-axis inclination and Y-axis inclination regarding the lower side LX and left side LY of the index 130 relative to the X-axis and Y-axis of the reference coordinate system are adequately corrected. Therefore, in step S6, the probe electrode can be accurately brought into contact with the solder ball(s) 120. At this time the prober applies a prescribed voltage (or a prescribed current) to the solder ball(s) 120 of the device chip via the probe electrode, whereby it is determined whether or not the probe electrode is accurately brought into contact with the solder ball(s) 120 upon the observation or detection of the current or voltage. When it is confirmed that the probe electrode is brought into contact with the solder ball(s) 120, the flow proceeds to step S7 in which a tester of the prober externally provided applies various signals to the device chip via the probe electrode in accordance with a prescribed test pattern, so that probing testing is performed.

2. Second Embodiment

In the first embodiment, the polished surface of the copper post 140A is directly used for the index 130, whereby the copper post 140A is exposed to the external atmosphere and may be easily damaged due to oxidation, which may affect the reliability in manufacture. In order to avoid this drawback, a second embodiment is constituted as shown FIG. 5 such that a solder layer 160 is further formed on the polished surface of the copper post 140A and is used for a discrimination member serving as the index 130.

Figure 5:
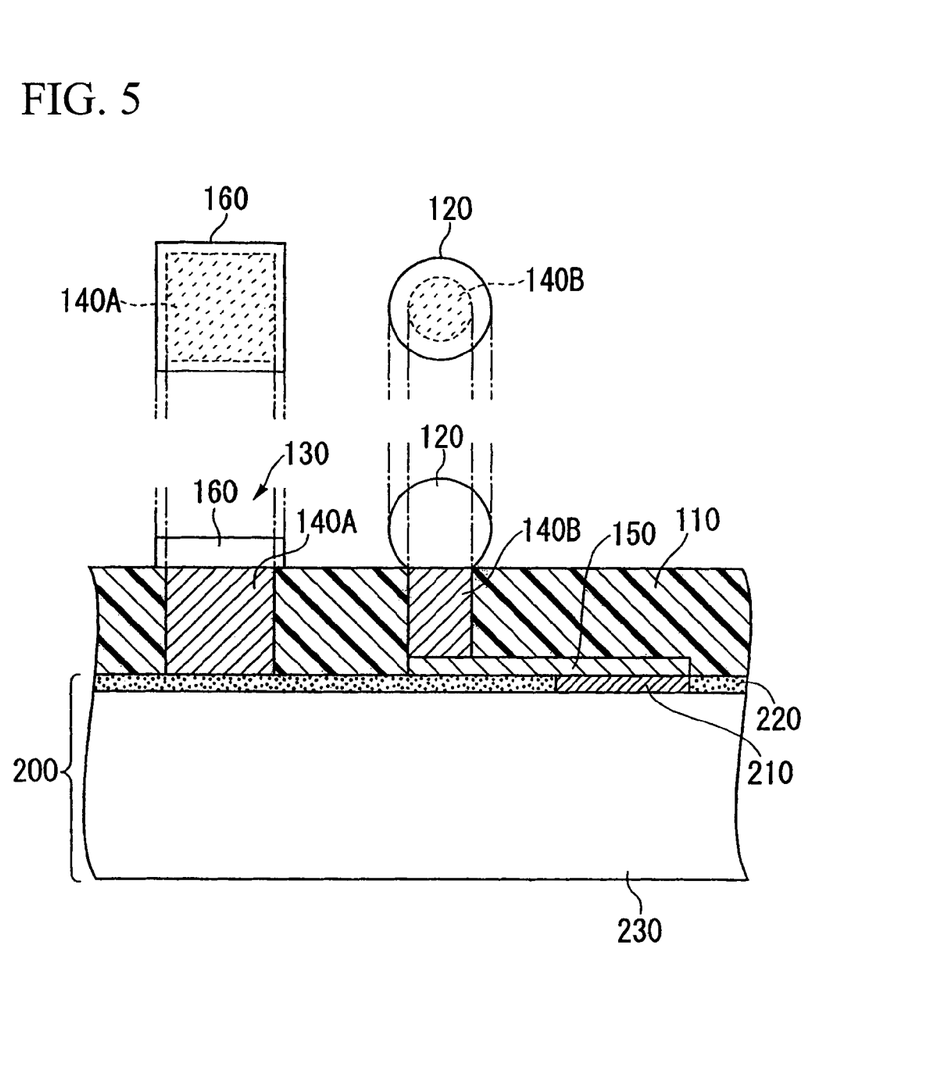
FIG. 5 is a cross sectional view showing the internal structure of a chip size package holding a semiconductor chip therein in accordance with a second embodiment of the invention.

In the above, the copper post 140A is increased in size compared with the copper post 140B, whereby the square sectional area of the copper post 140A becomes greater than the circular sectional area of the copper post 140B. The solder layer 160 is formed using the same material of the solder ball(s) 120 serving as external electrodes, wherein the material is subjected to heat treatment so as to form the solder layer 160 in the prescribed shape and size. As described above, the copper post 140A is determined in shape and size, and the solder layer 160 is formed using the same material of the solder ball(s) 120, wherein during the heat treatment performed on the solder, the solder layer 160 can be easily melted so as to match the shape of the copper post 140A; thus, it is possible to form the solder layer 160 having the square shape that may completely match the square shape of the copper post 140A. Herein, the solder layer 160 has the prescribed square shape having the directivity identical to that of the copper post 140A; hence, it can be used as the index 130 for positioning. Incidentally, the positioning method adopted in the second embodiment is identical to that of the first embodiment.

This invention has been described in detail by way of the aforementioned embodiments, which are not necessarily restrictive. That is, it is possible to provide modifications or design changes within the scope of the invention. For example, the aforementioned embodiments are designed to form the index 130 having the square shape, which is not necessarily restricted; that is, the index 130 is merely required to include at least one linear portion and at least one vertex in the outline thereof. In other words, the index 130 is not necessarily limited to the square shape as long as a good processing accuracy can be realized in positioning. In addition, the aforementioned embodiments use the copper post 140A or the solder layer 160 formed on the copper post 140A as the index 130, wherein it is possible to use other members or other materials as long as a good processing accuracy can be realized in the positioning established in the probing test. In order to avoid occurrence of oxidation of the copper post 140A, the second embodiment is characterized by covering the polished surface of the copper post 140A with the solder layer 160, which can be replaced with a solder print or a gold bump. Furthermore, this invention is described by way of the chip size package as an example of the surface mount chip package, whereas this invention can be adapted to other types of surface mount chip packages such as ball grid array (BGA) packages. Moreover, the index 130 is adequately shaped to function as a positioning mark used in the probing test in order that the user can easily discriminate external terminals. Of course, it is possible to arrange a positioning mark independently of the index.

As described heretofore, this invention has a variety of effects and technical features, which will be described below.

(1) A surface mount chip package of this invention is characterized by arranging a marking member (e.g., an index) whose shape realizes directivity in a package housing; that is, this marking member allows the user to visually recognize the inclination and position of the package housing with ease. This allows the user to easily establish prescribed positioning for an electrical test without using solder balls arranged on the surface of the package housing.

(2) The marking member is designed to include at least one linear portion in the outline thereof, which brings directivity in the shape thereof. This allows the user to easily recognize the inclination and position of the package housing in view of the shape of the marking member.

(3) A copper post is used as the marking member, which is thus easily formed in the prescribed shape and size so as to realize a good positioning accuracy. This marking member is advantageous in that it can be formed simultaneously with the formation of external electrodes; hence, it is possible to produce the surface mount chip package having the marking member without increasing the number of steps in manufacture.

(4) In the above, it is possible to avoid occurrence of the oxidation of the copper post serving as the marking member by simply covering the copper post with a solder layer, a solder print, or a gold bump.

(5) In addition, it is possible to secure at least one linear side and at least one vertex used for the positioning by simply forming the marking member having a square shape.

(6) Furthermore, the copper post serving as the marking member is increased in size compared with the other copper post provided for external electrodes, so that when the surface of the copper post is covered with the solder layer, the solder layer can be easily melted in a relatively broad range of area so as to realize a prescribed shape (e.g., a square shape) resembling the shape of the copper post. This brings a further improvement in a positioning accuracy.

As this invention may be embodied in several forms without departing from the spirit or essential characteristics thereof, the present embodiments are therefore illustrative and not restrictive, since the scope of the invention is defined by the appended claims rather than by the description preceding them, and all changes that fall within metes and bounds of the claims, or equivalents of such metes and bounds are therefore intended to be embraced by the claims.

What is claimed is:

1. A surface mount chip package incorporating a semiconductor chip having an integrated circuit, comprising:
    a package housing made of a resin that covers the semiconductor chip while avoiding a plurality of conductors extending from the semiconductor chip;
    a plurality of external electrodes that are arranged in the package housing in correspondence with a main surface of the semiconductor chip having the integrated circuit and are connected with the plurality of conductors extending from the semiconductor chip, the external electrodes each having a circular shape when viewing the chip package externally in a vertical direction when the semiconductor chip is held horizontally, said external electrodes being arranged in a peripheral area of the main surface; and
    at least one marking member that is arranged in the package housing so as to realize a directivity when viewing the chip package externally in the vertical direction, wherein an outline shape of the marking member includes at least one linear portion when viewing the chip package externally in the vertical direction, said marking member being arranged in a central area of the main surface in which no external electrode is arranged.

2. A surface mount chip package according to claim 1, wherein the marking member corresponds to a copper post that is arranged independently of the plurality of conductors.

3. A surface mount chip package according to claim 2, wherein the copper post serving as the marking member has a square shape.

4. A surface mount chip package according to claim 2, wherein the copper post is covered with a solder layer, a solder print, or a gold bump, thus realizing the marking member.

5. A surface mount chip package according to claim 4, wherein the marking member has a square shape.

6. A surface mount chip package according to claim 5, wherein the copper post serving as the marking member is increased in size compared with each of the plurality of conductors, which correspond to a plurality of copper posts.

7. A surface mount chip package according to claim 4, wherein the copper post serving as the marking member is increased in size compared with each of the plurality of conductors, which correspond to a plurality of copper posts.

8. A surface mount chip package according to claim 2, wherein the copper post is increased in size compared with each of the plurality of conductors.

* * * * *